US012269402B2

(12) United States Patent
Salter et al.

(10) Patent No.: US 12,269,402 B2
(45) Date of Patent: Apr. 8, 2025

(54) VEHICLE BODY PANEL ACCOMMODATING A DEPLOYABLE ELECTRICAL SYSTEM

(71) Applicant: Ford Global Technologies, LLC, Dearborn, MI (US)

(72) Inventors: Stuart C. Salter, White Lake, MI (US); Vyas Darshan Shenoy, Canton, MI (US); Paul Kenneth Dellock, Northville, MI (US); Jesse Rene Diephuis, West Bloomfield, MI (US); David Brian Glickman, Southfield, MI (US); Michael John Harmon, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 387 days.

(21) Appl. No.: 17/900,954

(22) Filed: Sep. 1, 2022

(65) Prior Publication Data
US 2024/0075891 A1  Mar. 7, 2024

(51) Int. Cl.
B60R 16/023 (2006.01)
H05K 5/02 (2006.01)

(52) U.S. Cl.
CPC ....... B60R 16/0238 (2013.01); H05K 5/0226 (2013.01)

(58) Field of Classification Search
CPC .................. B60R 16/0238; H05K 5/0226
See application file for complete search history.

(56) References Cited

U.S. PATENT DOCUMENTS

| 7,172,150 | B1 | 2/2007 | Hutchinson, II et al. |
| 7,231,994 | B2* | 6/2007 | Buglione ................ F02N 11/04 |
| | | | 180/65.8 |
| 9,120,391 | B2* | 9/2015 | Bianco .................... B60L 53/30 |
| 11,059,474 | B2 | 7/2021 | Revach et al. |
| 11,142,072 | B2 | 10/2021 | Bhat et al. |
| 2007/0252435 | A1 | 11/2007 | Coe et al. |
| 2017/0349039 | A1 | 12/2017 | Rayner et al. |
| 2020/0317057 | A1* | 10/2020 | Salter ..................... B60L 1/006 |
| 2022/0032796 | A1 | 2/2022 | Salter et al. |
| 2024/0025361 | A1* | 1/2024 | Salter ..................... B60R 16/03 |

* cited by examiner

Primary Examiner — Vanessa Girard
(74) Attorney, Agent, or Firm — Vichit Chea; Carlson, Gaskey & Olds, P.C.

(57) ABSTRACT

A vehicle electrical distribution system includes an electrical box having at least one power outlet. The electrical box is configured to be moved between a stowed position where the electrical box is housed within a compartment of a vehicle, and an deployed position where the electrical box is outside the compartment.

18 Claims, 3 Drawing Sheets

VEHICLE BODY PANEL ACCOMMODATING A DEPLOYABLE ELECTRICAL SYSTEM

TECHNICAL FIELD

This disclosure relates generally to a vehicle electrical distribution system having an electrical box that can be moved.

BACKGROUND

Some vehicles, such as pickup trucks, include a cargo bed. The cargo bed can be located behind a passenger compartment of the vehicle. A tailgate can enclose a rear, or aft, end of the cargo bed. Users use cargo beds to carry various types of loads and/or cargo.

SUMMARY

In some aspects, the techniques described herein relate to a vehicle electrical distribution system, including: an electrical box including at least one power outlet, the electrical box configured to be moved between a stowed position where the electrical box is housed within a compartment of a vehicle, and an deployed position where the electrical box is outside the compartment.

In some aspects, the techniques described herein relate to a vehicle electrical distribution system, wherein the compartment is between a bedside panel of the vehicle and a cargo bed side wall.

In some aspects, the techniques described herein relate to a vehicle electrical distribution system, further including a door assembly in the bedside panel, the door assembly rotatable relative to a remainder of the bedside panel between a closed position where the door assembly covers the compartment and is substantially flush with the remainder of the bedside panel and an open position where the compartment is uncovered by the door assembly.

In some aspects, the techniques described herein relate to a vehicle electrical distribution system, wherein the electrical box in the stowed position is configured to rotate with the door assembly back and forth between the closed position and the open position.

In some aspects, the techniques described herein relate to a vehicle electrical distribution system, wherein the bedside panel includes an opening, the at least one power outlet of the electrical box accessible through the opening when the electrical box is in the stowed position and the door assembly is in the closed position.

In some aspects, the techniques described herein relate to a vehicle electrical distribution system, further including a cover that is movable to a position that blocks access to the at least one power outlet through the opening when the electrical box is in the stowed position and the door assembly is in the closed position.

In some aspects, the techniques described herein relate to a vehicle electrical distribution system, further including an electrical cord that electrically couples the electrical box to the vehicle when the electrical box is removed from the compartment.

In some aspects, the techniques described herein relate to a vehicle electrical distribution system, further including a reel within the compartment, the electrical cord wound around the reel when the electrical box is housed within the compartment.

In some aspects, the techniques described herein relate to a vehicle electrical distribution system, further including a retractable handle coupled to the electrical box.

In some aspects, the techniques described herein relate to a vehicle electrical distribution system, further including a plurality of wheels coupled to the electrical box.

In some aspects, the techniques described herein relate to a vehicle electrical distribution system, wherein the vehicle is a pickup truck.

In some aspects, the techniques described herein relate to a vehicle electrical distribution system, wherein a bottom of the compartment is vertically beneath a floor of a cargo bed of the vehicle.

In some aspects, the techniques described herein relate to a vehicle electrical distribution system, wherein the electrical box is configured to electrically output from 4000 to 8000 Watts.

In some aspects, the techniques described herein relate to a vehicle electrical distribution method, including: moving a door from a closed position to an open position, the door covering a compartment of a vehicle when the door is in the closed position; and removing a electrical box that includes at least one power outlet from the compartment while keeping the electrical box electrically coupled to the vehicle.

In some aspects, the techniques described herein relate to a vehicle electrical distribution method, further including powering a device from the at least one power outlet the electrical box when the electrical box is outside the compartment.

In some aspects, the techniques described herein relate to a vehicle electrical distribution method, further including returning the electrical box to the compartment and powering the device or another device from the at least one power outlet of the electrical box when the electrical box is inside the compartment.

In some aspects, the techniques described herein relate to a vehicle electrical distribution method, further including accessing the at least one power outlet through an opening in a bedside panel when the electrical box is in the compartment.

In some aspects, the techniques described herein relate to a vehicle electrical distribution method, wherein the compartment is between a bedside panel of the vehicle and a cargo bed side wall.

In some aspects, the techniques described herein relate to a vehicle electrical distribution method, wherein the power outlet is one of a plurality of power outlets of the electrical box.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure details an electrical distribution system for a vehicle. The system includes an electrical box having at least one power outlet. The electrical box can be stowed within the vehicle or can be deployed to a position remote from the vehicle. Devices, such as tools, can be powered by the vehicle through the electrical box when the electrical box is deployed.

With reference to FIGS. 1-5, a motor vehicle 10 ("vehicle 10"), in this example, is a pickup truck. While beneficial in the context of pickup trucks, this disclosure could extend to other vehicles besides pickup trucks, such as sport utility vehicles (SUVs), cars, vans, etc. The vehicle 10 can have either a unibox architecture or a box-on-frame architecture, as examples. The vehicle 10 can be an electrified vehicle such as a battery electric vehicle (BEV), plug-in hybrid electric vehicle (PHEV). Alternatively, the vehicle 10 could be a conventional vehicle powered solely or primarily by an internal combustion engine.

The vehicle 10 includes a passenger cabin 12 and, rearward of the passenger cabin 12, a cargo bed 14. The cargo bed 14 is an open-topped cargo area in this example. In other examples, the cargo bed 14 can be closed by a movable cover, such as a tonneau cover, or a fixed cover, such as a truck cap.

Figure 1:
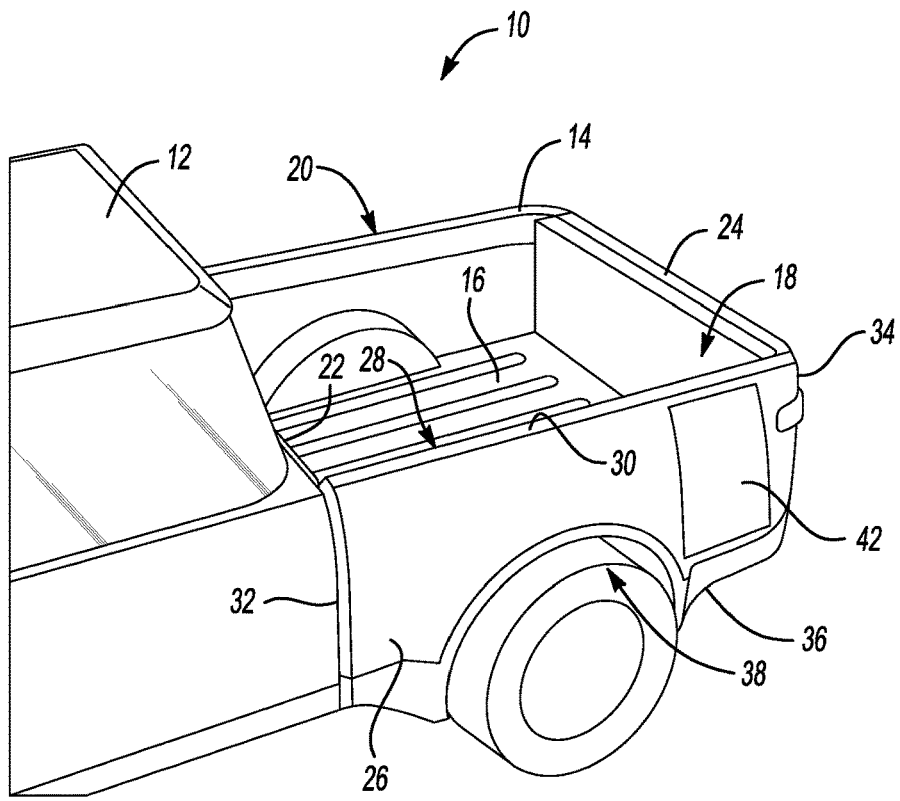
FIG. 1 illustrates a portion of an example motor vehicle having an electrical box in a stowed position and a door assembly in a closed position.
Figure 2:
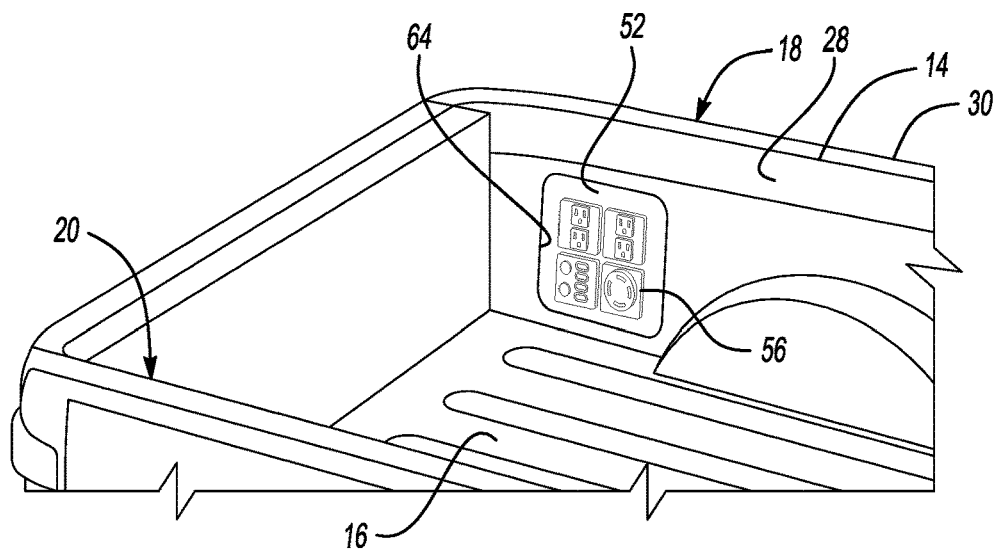
FIG. 2 illustrates another view of the motor vehicle of FIG. 1 showing at least one electrical outlet accessible when the electrical box is in the stowed position and the door is in the closed position.

The cargo bed 14 includes bottom surface, or floor 16, a first side 18 extending along a first side of the floor 16, a second side 20 extending along a second side of the floor 16 opposite the first side 18, a front wall 22, and a tailgate 24. In FIG. 1, the tailgate 24 is in a closed position. When in the closed position, the tailgate 24 encloses the cargo bed 14 from the rear. When the tailgate 24 is open, a user may access to the cargo bed 14 from the rear.

Additional detail of the first side 18 will now be described. The second side 20 may be arranged substantially similar to the first side 18. The first side 18 includes a bedside panel 26 mounted to an outer side of a portion of the frame of the vehicle 10. The bedside panel 26 provides an exterior surface of the vehicle 10. The first side 18 also includes cargo bed side wall 28. The bedside panel 26 and the cargo bed side wall 28 are connected at respective top edges by a top rail 30 of the first side 18, in this example. The top rail 30 extends substantially from a location adjacent the front wall 22 to a location adjacent the tailgate 24.

The bedside panel 26 exhibits a length from a front edge 32 adjacent a rear of the passenger cabin 12 to a rear edge 34 adjacent the tailgate 24. Further, the bedside panel 26 exhibits a height between a bottom edge 36 and the top rail 30. The bottom edge 36 is contoured along its length to accommodate a wheel well 38.

The first side 18 includes a compartment 40 between the bedside panel 26 and the cargo bed side wall 28. A door assembly 42 is formed in the bedside panel 26. The door assembly 42 is movable back-and-forth between the closed position of FIGS. 1 and 2 and the open position of FIGS. 3 and 4. In particular, the door assembly 42 is hinged to the first side 18 and is rotatable relative to a remainder of the bedside panel 26 between the closed position where the door assembly 42 covers the compartment 40 and is substantially flush with the remainder of the bedside panel 26 and the open position where the compartment 40 is uncovered by the door assembly 42.

The vehicle 10, in some examples, has a door ajar alert associated with the door assembly 42, which can notify a driver that the door assembly 42 is in the open position. The vehicle 10 may be configured to not move when the door assembly 42 is in the open position. When in the open position, an override switch may be required to move the vehicle 10.

The compartment 40 is accessible when the door assembly 42 is in the open position. The compartment 40 has a length between a front wall 44 and rear wall 46, and a height between compartment floor 48 and compartment ceiling 50.

A electrical box 52 can be housed within the compartment 40. The electrical box 52 includes at least one power outlet 56. When housed within the compartment 40, the electrical box 52 is in a stowed position. The electrical box 52 can be moved to an deployed position where the electrical box 52 is outside the compartment. The compartment 40 can be illuminated by a light 54 provided by a taillight or from another light within the compartment 40. The other light can be a takeout from the taillight. The light 54 can include one or more RGB LEDs that automatically illuminate in response to the door assembly 42 being in the open position.

In the stowed position, the example electrical box 52 is slidably received within a bracket 60 on a backside of the door assembly 42. In the stowed position, the electrical box 52 moves with the door assembly 42 as the door assembly 42 moves back and forth between the closed position of FIGS. 1 and 2 and the open position of the FIGS. 3 and 4.

In the stowed position, with the door assembly 42 in the closed position, the at least one power outlet 56 can be accessed through an opening 64 in the cargo bed side wall 28. That is, devices can be coupled to the at least one power outlet 56 so that the devices can be powered by the vehicle 10. The compartment floor 48, in this example, is disposed vertically beneath the floor 16, which helps to provide enough area in the compartment 40 to accommodate the electrical box 52 and can help to orient the at least one power outlet 56 at an appropriate location when accessed through the cargo bed side wall 28. The compartment 40 having the compartment floor 48 beneath the floor 16 is larger than if the compartment floor 48 were aligned with the floor 16, which helps to accommodate an electrical box that is larger.

If access to the at least one power outlet 56 is not required, a closure panel 68 can be fit within the opening 64 to cover the at least one power outlet 56. The closure panel 68 can be used when the cargo bed 14 is hauling cargo to prevent the cargo, such as dirt or debris, from coming into contact with the at least one power outlet 56.

Figure 3:
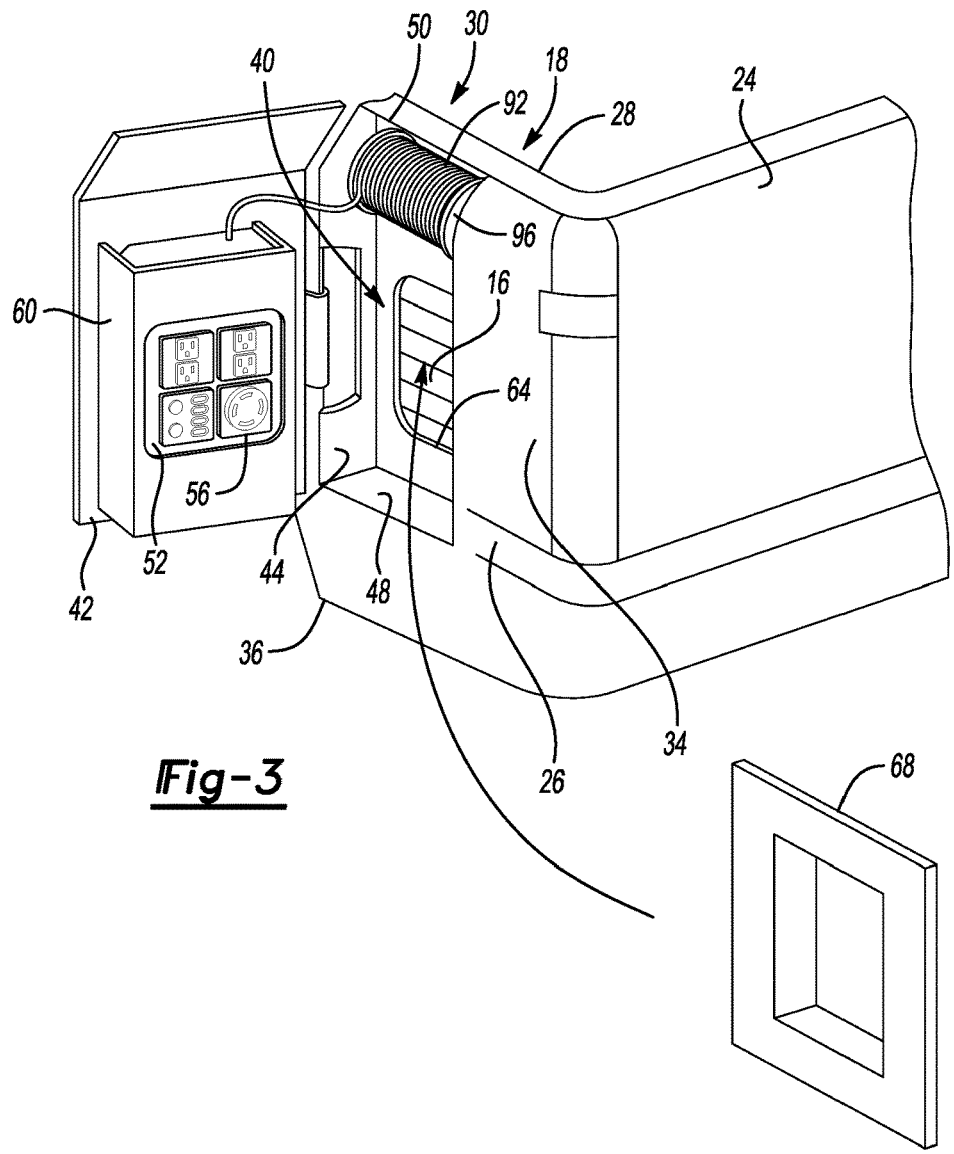
FIG. 3 illustrates another view of the motor vehicle of FIG. 1 showing the at least one electrical outlet accessible when the electrical box is in the stowed position and the door is in the open position.
Figure 4:
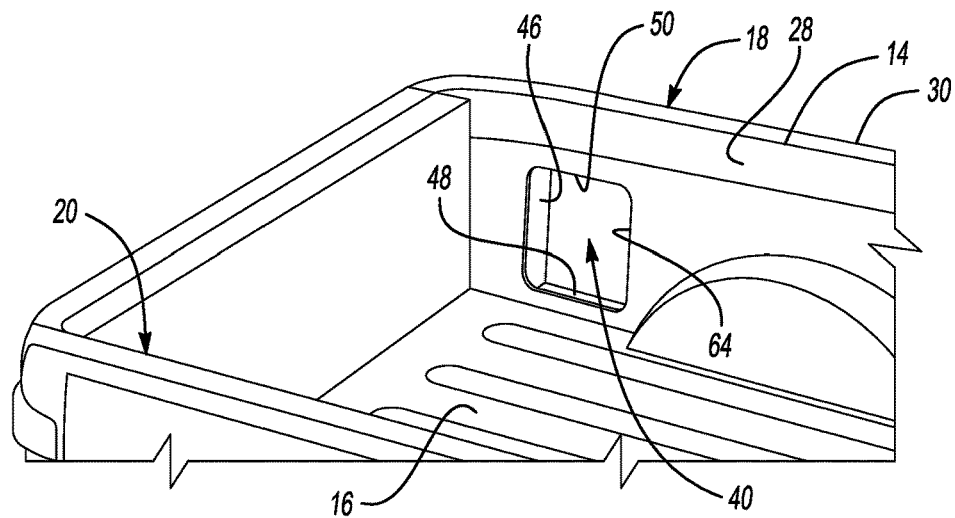
FIG. 4 illustrates another view of the motor vehicle of FIG. 1 when the electrical box is in the stowed position and the door is in the open position.
Figure 5:
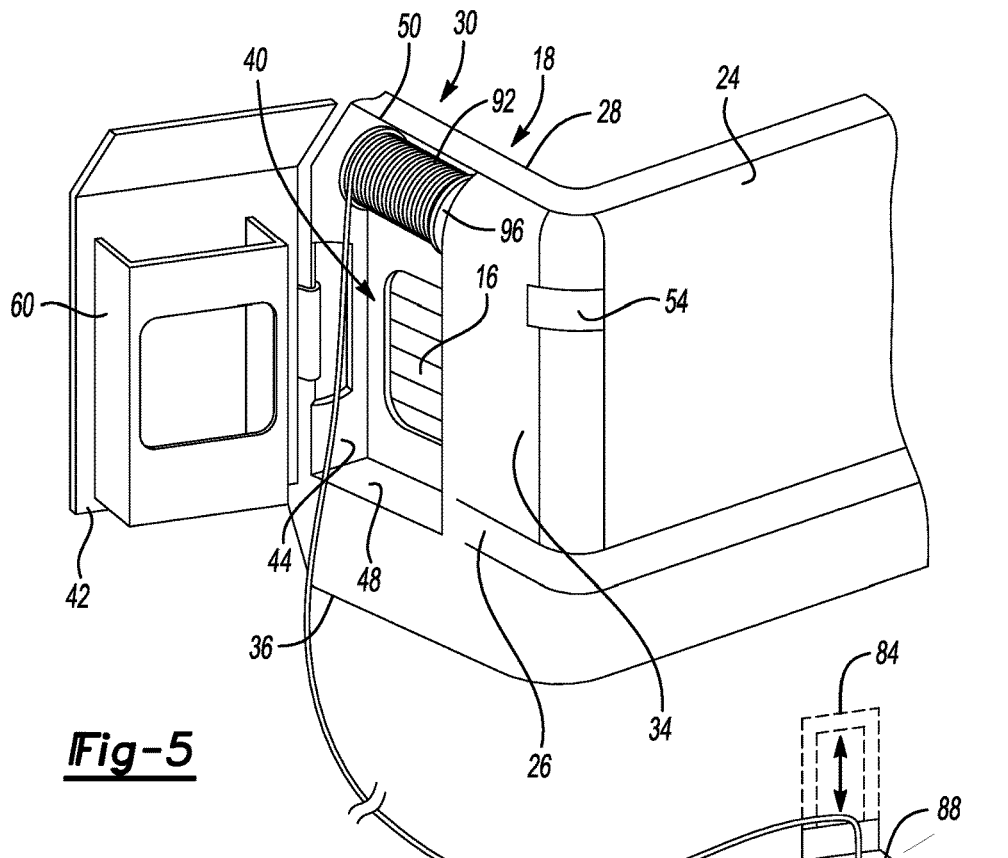
FIG. 5 illustrates another view of the motor vehicle of FIG. 1 showing the at least one electrical outlet accessible when the electrical box is in an deployed position.

In the stowed position, as shown in FIG. 3, the at least one power outlet 56 can be accessed by moving the door assembly 42 to the open position. This can provide access to the at least one power outlet 56 even if the cargo bed 14 is filled with cargo and blocking access through the opening 64.

Figure 6:
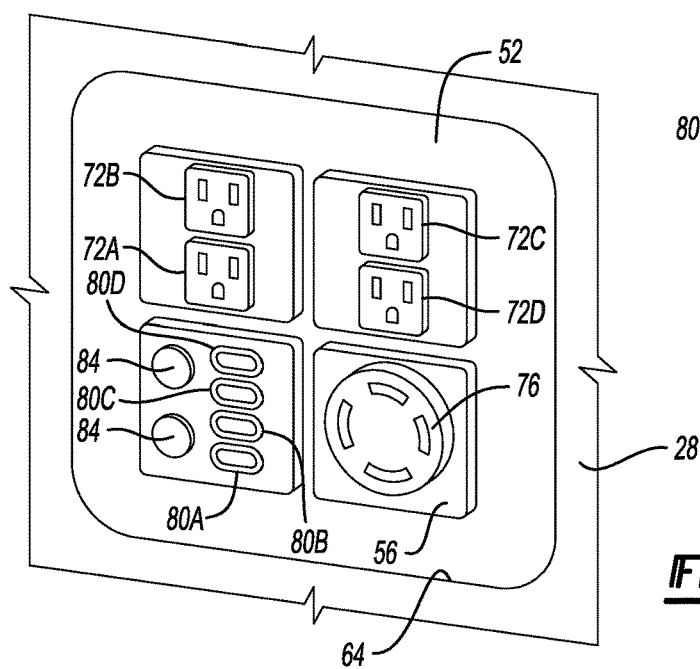
FIG. 6 illustrates another view of the motor vehicle of FIG. 1 showing a close up view of the at least one electrical outlet of the electrical box.

With reference to FIG. 6, the at least one power outlet 56 of the electrical box 52 includes a plurality of power outlets of different types. In this example, the electrical box 52 includes four, three-pronged, 120 Volt power outlets 72A-72D. The electrical box 62 also includes a 240 Volt power outlet 76. Finally, the electrical box 62 includes four USB-C outlets 80A-80D and two status lights 84A, 84B. While a particular power outlet arrangement is shown and described, this disclosure extends to other arrangements of power outlets including other types of power outlets. The power outlets can be controlled using smartphone activation. The electrical box 52 is configured to electrically output from 4000 to 8000 Watts.

With reference to FIG. 6, the electrical box 52 can be moved from the stowed position to the deployed position so that the at least one power outlet 56 can be accessed from an area that is outside the cargo bed 14, The electrical box 52 is removed from the compartment 40 when the electrical box 52 is deployed.

The electrical box 52 can include a plurality of wheels 80, a retractable handle 84, and a light 88 to facilitate moving the electrical box 52 to a desired location. When in the deployed position, the electrical box 52 remains electrically coupled to the vehicle 10 via a cord 92. The cord 92 is held on a reel 96 (FIG. 3) when the electrical box 52 is in the stowed position. The cord 92 can be automatically wound around the reel 96 when the electrical box 52 is moved from the deployed position back to the stowed position.

In some examples, the reel 96 is removable and can be stored in a lower area of the compartment 40 when not needed.

Devices can be coupled to the at least one power outlet 56 and powered by the vehicle 10 when the electrical box 52 is in the deployed position. The electrical box 52 could, for example, be inside a home that is being remodeled when in the deployed position. The various tools used by workers could be powered by coupling the various tools to the at least one power outlet 56. The cord 92 extends from the electrical box 52 inside the home to the vehicle 10 that is outside the home. Electrical power from the vehicle 10 moves through the cord 92 to the electrical box 52, and then to the various tools that are electrically coupled to the electrical box 52.

In some examples, the vehicle 10 can automatically assess the area surrounding the vehicle 10 to locate an optimized location for providing power to the electrical box when the electrical box 52 is within the home. The vehicle 10 may, for example, identify a location in a yard surrounding the home that reduces an amount of the cord 92 that is outside the home when powering the electrical box 52 and thus, increases an amount of the cord 92 available for repositioning the electrical box 52 within the home. The vehicle 10 may, for example, factor in how when areas surrounding the home are, so that the vehicle 10 is positioned in an area that is relatively dry and thus less likely to introduce moisture to the cord 92 or electrical box 52.

The preceding description is exemplary rather than limiting in nature. Variations and modifications to the disclosed examples may become apparent to those skilled in the art that do not necessarily depart from the essence of this disclosure. Thus, the scope of protection given to this disclosure can only be determined by studying the following claims.

What is claimed is:

1. A vehicle electrical distribution system, comprising:
    an electrical box including at least one power outlet, the electrical box configured to be moved between a stowed position where the electrical box is housed within a compartment of a vehicle, and an deployed position where the electrical box is outside the compartment; and
    a plurality of wheels coupled to the electrical box.

2. A vehicle electrical distribution system, comprising:
    an electrical box including at least one power outlet, the electrical box configured to be moved between a stowed position where the electrical box is housed within a compartment of a vehicle, and an deployed position where the electrical box is outside the compartment and
    an electrical cord that electrically couples the electrical box to the vehicle when the electrical box is removed from the compartment.

3. The vehicle electrical distribution system of claim 2, further comprising a reel within the compartment, the electrical cord wound around the reel when the electrical box is housed within the compartment.

4. The vehicle electrical distribution system of claim 2, further comprising a retractable handle coupled to the electrical box.

5. The vehicle electrical distribution system of claim 2, wherein the vehicle is a pickup truck.

6. The vehicle electrical distribution system of claim 2, wherein a bottom of the compartment is vertically beneath a floor of a cargo bed of the vehicle.

7. The vehicle electrical distribution system of claim 2, wherein the electrical box is configured to electrically output from 4000 to 8000 Watts.

8. The vehicle electrical distribution system of claim 2, wherein the compartment is between a bedside panel of the vehicle and a cargo bed side wall.

9. The vehicle electrical distribution system of claim 8, further comprising a door assembly in the bedside panel, the door assembly rotatable relative to a remainder of the bedside panel between a closed position where the door assembly covers the compartment and is substantially flush with the remainder of the bedside panel and an open position where the compartment is uncovered by the door assembly.

10. The vehicle electrical distribution system of claim 9, wherein the electrical box in the stowed position is configured to rotate with the door assembly back and forth between the closed position and the open position.

11. The vehicle electrical distribution system of claim 10, wherein the bedside panel includes an opening, the at least one power outlet of the electrical box accessible through the opening when the electrical box is in the stowed position and the door assembly is in the closed position.

12. The vehicle electrical distribution system of claim 11, further comprising a cover that is movable to a position that blocks access to the at least one power outlet through the opening when the electrical box is in the stowed position and the door assembly is in the closed position.

13. A vehicle electrical distribution method, comprising:
    moving a door from a closed position to an open position, the door covering a compartment of a vehicle when the door is in the closed position; and
    removing a electrical box that includes at least one power outlet from the compartment while keeping the electrical box electrically coupled to the vehicle.

14. The vehicle electrical distribution method of claim 13, wherein the compartment is between a bedside panel of the vehicle and a cargo bed side wall.

15. The vehicle electrical distribution method of claim 13, wherein the at least one power outlet is one of a plurality of power outlets of the electrical box.

16. The vehicle electrical distribution method of claim 13, further comprising powering a device from the at least one power outlet the electrical box when the electrical box is outside the compartment.

17. The vehicle electrical distribution method of claim 16, further comprising returning the electrical box to the compartment and powering the device or another device from the at least one power outlet of the electrical box when the electrical box is inside the compartment.

18. The vehicle electrical distribution method of claim 17, further comprising accessing the at least one power outlet through an opening in a bedside panel when the electrical box is in the compartment.

* * * * *